United States Patent [19]
Oldham

[11] 4,013,489
[45] Mar. 22, 1977

[54] PROCESS FOR FORMING A LOW RESISTANCE INTERCONNECT IN MOS N-CHANNEL SILICON GATE INTEGRATED CIRCUIT

[75] Inventor: William G. Oldham, El Cerrito, Calif.

[73] Assignee: Intel Corporation, Santa Clara, Calif.

[22] Filed: Feb. 10, 1976

[21] Appl. No.: 656,933

[52] U.S. Cl. .................................. 148/174; 29/571; 29/578; 29/589; 148/1.5; 148/187; 148/188; 357/23; 357/41; 357/51; 357/59; 427/86; 427/85

[51] Int. Cl.[2] ................ H01L 21/225; H01L 21/20; H01L 27/02

[58] Field of Search ........... 148/1.5, 174, 187, 188; 427/85, 86; 29/571, 578, 589; 357/41, 51, 52, 59, 23

[56] References Cited

UNITED STATES PATENTS

| | | | |
|---|---|---|---|
| 3,519,901 | 7/1970 | Bean et al. | 148/174 X |
| 3,699,646 | 10/1972 | Vadasz | 29/571 |
| 3,747,200 | 7/1973 | Rutledge | 29/571 |
| 3,750,268 | 8/1973 | Wang | 29/571 |
| 3,775,191 | 11/1973 | McQuhae | 148/1.5 |
| 3,843,425 | 10/1974 | Katnack | 148/188 X |
| 3,904,450 | 9/1975 | Evans et al. | 148/175 |

OTHER PUBLICATIONS

Bassous, E., "Fabricating Submicrometer Silicon Devices", I.B.M. Tech. Discl. Bull., vol. 15, No. 6, Nov. 1972, pp. 1823–1825.

*Primary Examiner*—L. Dewayne Rutledge
*Assistant Examiner*—W. G. Saba
*Attorney, Agent, or Firm*—Blakely, Sokoloff, Taylor & Zafman

[57] ABSTRACT

A low resistance crossunder (interconnect) for n-channel, silicon gate integrated circuits, particularly useful where shallow source and drain regions are employed. The crossunder is formed in the substrate from a doped polycrystalline silicon layer which contacts the substrate at the site of the crossunder. The crossunder is formed without substantial alterations to the standard process flow.

9 Claims, 5 Drawing Figures

PROCESS FOR FORMING A LOW RESISTANCE INTERCONNECT IN MOS N-CHANNEL SILICON GATE INTEGRATED CIRCUIT

BACKGROUND OF THE INVENTION

1. Field of the Invention

The invention relates to the fabrication of interconnecting means in MOS integrated circuits.

2. Prior Art

Interconnecting means are frequently employed in MOS integrated circuits to interconnect devices on a substrate and to provide lines for external connections. These interconnects are typically fabricated from polycrystalline silicon or metal such as aluminum, or are highly doped regions in the substrate, referred to as crossunders.

With current n-channel, silicon gate, MOS processing the crossunder interconnects are doped simultaneously with the doping of the source and drain regions. Typically, a polycrystalline silicon layer is masked to define the silicon gates and silicon interconnecting lines, and also to define the location of sites of crossunders. After this layer and an underlying gate oxide layer are etched the substrate is then subjected to a phosphorus dopant. In this manner, the source and drain regions and crossunders are formed in the substrate, and the polycrystalline silicon gates and lines are simultaneously doped. Where the phosphorus predeposition occurs at approximately 950° C, the resistance of the diffused crossunders in the silicon substrate is approximately 10 ohms/sq. By way of comparison the polycrystalline silicon formed in this process has a resistance of approximately 30 ohms/sq. (The lower resistance of the crossunders when compared to the polycrystalline silicon, stems from the high carrier mobility of electrons in the monocrystalline silicon). This process provides relatively low resistance in all layers, however, because of the deep diffusion in the substrate the resultant devices have relatively high Miller and junction capacitance.

Recently there has been a trend in MOS processing to improve device performance by employing shallower source and drain regions. These shallower regions provide higher performance since the Miller and junction capacitance is reduced. By way of example, where phosphorus doping occurs at approximately 850° C the resistance of crossunders formed along with the formation of the source and drain regions is approximately 25 ohms/sq. and the resistance of the doped polycrystalline silicon is approximately 80 ohms/sq. Thus, while a device fabricated in this manner provides improved performance the resistance of the diffused silicon and doped polycrystalline silicon is substantially increased.

In some cases arsenic is employed as a dopant for the source and drain regions to provide even shallower regions. The crossunders and polycrystalline silicon which are ion implanted simultaneously with the formation of the source and drain regions have relatively high resistance. For example, where the arsenic concentration from this ion implantation is approximately $3 \times 10^{15}/cm^2$, the resistance of the diffused crossunders is approximately 30 ohms/sq. and the resistance of the polycrystalline silicon is approximately 100 ohms/sq.

The invented process provides relatively low resistance crossunders (e.g. 10 ohms/sq.) without substantial alteration to the standard, n-channel, silicon gate process referred to above. The disclosed process is particularly useful where the shallower arsenic or phosphorus source and drain regions are employed, although it may be used with the deeper phosphorus source and drain regions.

SUMMARY OF THE INVENTION

An improvement in an MOS process for fabricating n-channel, silicon gate devices on a silicon substrate which provides low resistance crossunders is described. In the prior art process a polycrystalline silicon layer is formed on an oxide layer. Then the polycrystalline silicon layer is etched forming predetermined patterns such that at least source and drain regions may be doped in the substrate in alignment with these patterns. In the improved process, however, the oxide layer at the proposed site of a crossunder is removed prior to the formation of the polycrystalline silicon layer. The polycrystalline silicon layer is then doped before it is etched. Since the doped polycrystalline silicon layer directly contacts the substrate at the proposed site of the crossunder, a low resistance crossunder at the point of contract is formed in the substrate.

The drawings are not to scale in order that the various regions and areas of interest may be clearly illustrated.

DETAILED DESCRIPTION OF THE INVENTION

An improved MOS process for fabricating n-channel, silicon gate devices with low resistance crossunders is described. As will be appreciated, variations of the described process may be employed, these variations will be obvious to one skilled in the art. In some instances, descriptions of well-known photolithographic steps have not been included in order not to obscure the invented process in unnecessary detail.

Figure 1:
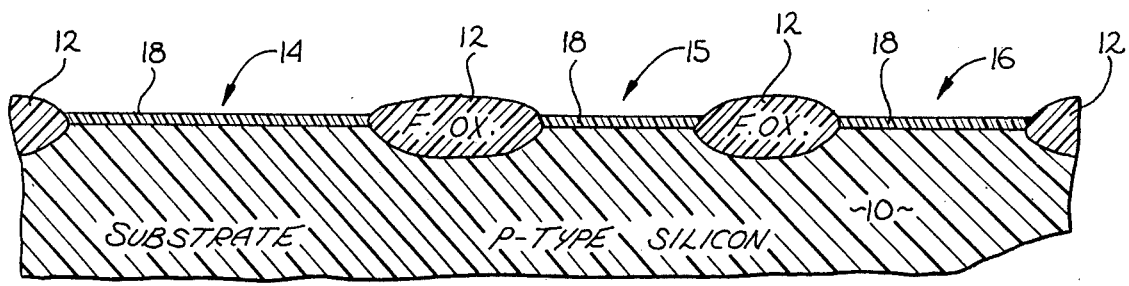
FIG. 1 is a cross-sectional elevation view of a portion of a silicon substrate which includes a gate oxide layer and a field oxide layer.

Referring first to FIG. 1, a p-type silicon substrate 10 includes an oxide layer 18 fabricated on the upper surface of this substrate. The layer 18 often referred to as a gate oxide layer, may be a thermally grown oxide (i.e. SiO, SiO$_2$). This layer for current n-channel fabrication is typically approximately 1000A thick.

The surface of the substrate of FIG. 1 is separated into three areas by a field-oxide layer 12. Specifically, the areas 14, 15 and 16 are separated, one from the other, by the field oxide layer 12. The following description describes the formation of a crossunder at the area 15. In describing the invented process, reference will be made to the fabrication of a buried contact at area 14 and a transistor at area 16. The fabrication of this buried contact and transistor is presented to illustrate the variations from prior art processing employed with the improved process.

Often in the fabrication of MOS integrated circuits a field-oxide layer is employed to separate regions of the substrate. Field-oxide layers, such as layer 12 of FIG. 1, may be fabricated with known photolithographic techniques, typically employing silicon nitride masking members. Such field-oxide layers generally surround devices, or groups of devices, however as will be appreciated, with the cross-sectional elevation view of FIG. 1, this aspect of the field-oxide layer is not illustrated.

Figure 2:
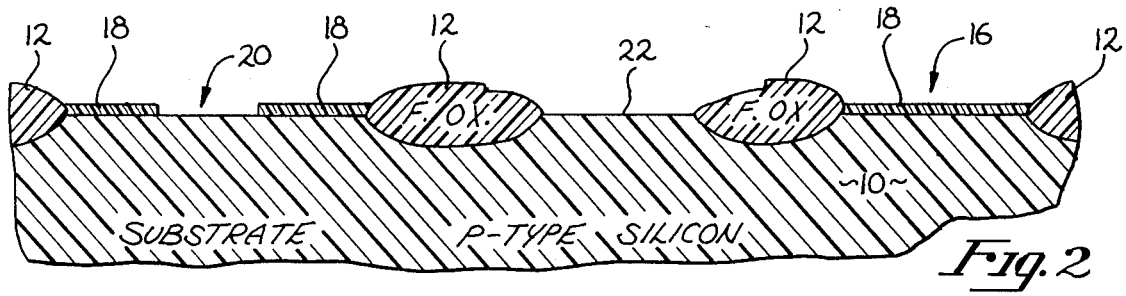
FIG. 2 illustrates the substrate of FIG. 1 with portions of the gate oxide layer removed.

The gate oxide 18 of FIG. 1 is removed from the upper surface of the substrate 10 at the proposed or predetermined site or sites of the crossunders. For example, in FIG. 2, the oxide layer 18 is removed at area 22, since a crossunder will be fabricated at this site. As will be appreciated the crossunder may be an elongated line, or comprise any one of a plurality of desired configurations. If the substrate 10 is to include a buried contact, a window is opened through the oxide 18 (such as window 20) for such buried contact. Known photolithographic techniques may be employed to define the area 22 and window 20 at the same time. It should be noted that the removal of the oxide 18 at area 22 is a departure from the prior art processing. In the prior art the substrate areas designated for crossunders were not exposed at this point in the processing.

Figure 3:
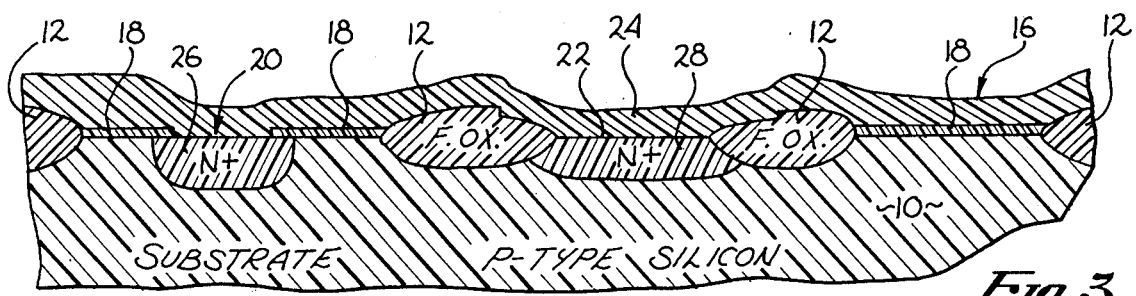
FIG. 3 illustrates the substrate of FIG. 2 with a polycrystalline silicon layer formed on the upper surface of the substrate.
Figure 4:
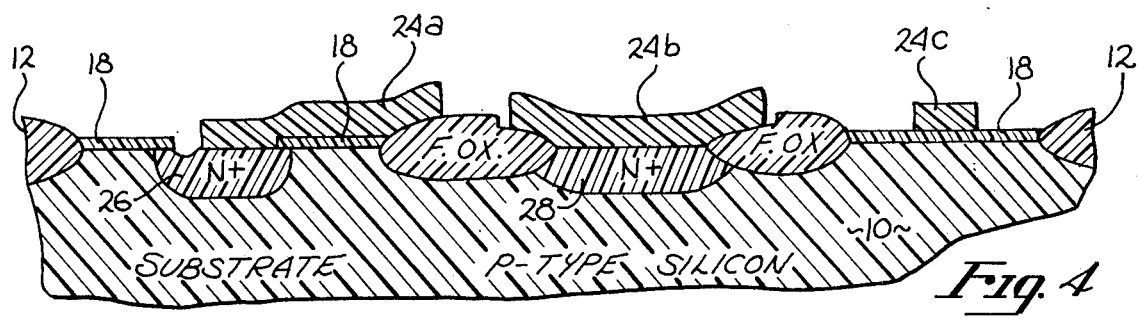
FIG. 4 illustrates the substrate of FIG. 3 with a buried contact region and crossunder region formed in the substrate.

As illustrated in FIG. 3, a polycrystalline silicon layer 24 is next formed on the upper surface of the substrate 10. Note that this layer contacts the substrate at area 22 and through the window 20. Layer 24 is then heavily doped with an n-type dopant. In the presently preferred embodiment phosphorus dopant is employed in a standard predeposition furnace at a temperature of approximately 950° C. The phosphorus dopant is driven into the substrate at area 22 and at window 20 to form the n-type crossunder 28 and contact region 26, respectively. The doping of the polycrystalline layer 24 at this point in the processing is a departure from the prior art processing where the layer 24 is first etched, and then doped when the source and drain regions, crossunders and buried contact regions are formed.

Figure 5:
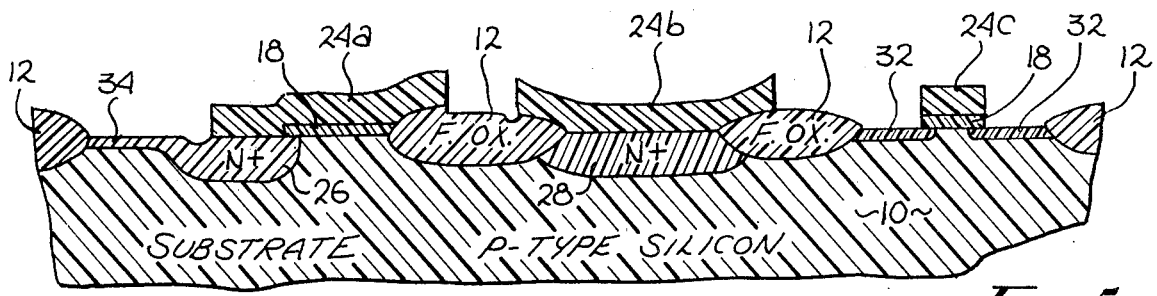
FIG. 5 illustrates the substrate of FIG. 4 with shallow n-type regions formed in the substrate.

The polycrystalline layer 24 is then etched with well-known photolithographic techniques to form a buried contact 24a, member 24b and gate 24c, all shown in FIG. 8. Then as shown in FIG. 5, the gate oxide 18 is etched and the source and drain regions or other diffused regions are formed within the substrate. For example, shallower phosphorus regions than those employed for crossunder 28 and contact 26 may be formed to obtain the higher performance associated with shallower source and drain regions. In the presently preferred embodiment, however, an arsenic dopant is ion implanted to form the n-type regions 32 and 34. These regions are substantially shallower than the contact region 26 and crossunder 28 to reduce the Miller and junction capacitance.

As will be appreciated the crossunder region 28 may connect with other regions in the substrate or the member 24b (which itself may be a line) may be coupled to other polycrystalline silicon or aluminum members.

Thus, the present invention combines the advantages of the low resistance, deep phosphorus crossunders with the advantages of the shallower phosphorus or arsenic source and drain regions. This result is obtained without substantial alteration to existing process flow. As described, the alteration to existing process flow includes the removal of the gate oxide at the site of the proposed crossunder prior to the formation of the polycrystalline silicon layer. This removal, however, may be accomplished in conjunction with the formation of windows for buried contacts. The other significant departure from prior art processing is the doping of the polycrystalline layer prior to the etching of this layer. This enables the formation of the deep phosphorus regions in the substrate employed for the crossunders and buried contacts prior to the formation of the source and drain regions.

I claim:

1. In an MOS process for fabricating n-channel, silicon gate devices on a silicon substrate, where a polycrystalline silicon layer is formed on an oxide layer and where said polycrystalline silicon layer is etched in predetermined patterns such that at least source and drain regions may be doped in said substrate in alignment with said predetermined patterns, an improvement in said process wherein a low resistance crossunder is formed at a proposed site in the substrate comprising:

removing said oxide layer at said proposed site of said crossunder prior to the formation of said polycrystalline silicon layer; and doping said polycrystalline silicon layer prior to said etching of said layer;

whereby said polycrystalline silicon layer contacts said substrate at said site of said crossunder, thereby forming a low resistance crossunder in said substrate.

whereby said polycrystalline silicon layer directly contacts said substrate at said site of said crossunder, thereby forming a low resistance crossunder at the point of contact in said substrate.

2. The improved process defined by claim 1 wherein said polycrystalline layer is doped with phosphorus.

3. In an MOS process for fabricating n-channel, silicon gate devices on a silicon substrate, where a polycrystalline layer is formed on a gate oxide layer and where said polycrystalline silicon layer is etched in predetermined patterns such that arsenic source and drain regions may be implanted in said substrate in alignment with said predetermined patterns, an improvement in said process wherein a low resistance crossunder is formed in said substrate at a proposed location comprising:

removing said gate oxide layer at said proposed location of said crossunder prior to the formation of said polycrystalline silicon layer; and doping said polycrystalline silicon layer with phosphorus prior to said etching of said silicon layer such that dopant from said silicon layer diffuses into said substrate at said proposed location;

whereby a low resistance phosphorus crossunder is formed in said substrate at said proposed location.

4. An MOS process for simultaneously fabricating an n-channel transistor and a low resistance crossunder region at a predetermined site on a silicon substrate comprising the steps of:

forming a gate oxide layer on said substrate;

removing a portion of said gate oxide layer at said predetermined site;

forming a polycrystalline silicon layer on said gate oxide layer, said polycrystalline silicon layer contacting said substrate at said predetermined site;

doping said polycrystalline silicon layer with an n-type dopant such that dopant from said silicon layer diffuses into said substrate at said predetermined site to define said crossunder region;

etching said polycrystalline silicon layer to define at least a gate for said transistor; and forming a source and drain region for said transistor with an n-type dopant in alignment with said gate;

whereby a low resistance crossunder region may be fabricated simultaneously with the fabrication of an n-channel transistor.

5. The process defined by claim 4 wherein said polycrystalline silicon layer is doped with a phosphorus dopant.

6. The process defined by claim 5 wherein said source and drain regions are doped with a phosphorus dopant and wherein said source and drain regions are shallower than said crossunder region.

7. The process defined by claim 4 wherein an arsenic dopant is employed for said doping of said source and drain regions.

8. The process defined by claim 7 wherein said arsenic dopant is ion implanted.

9. The process defined by claim 4 wherein a window for a buried contact is formed through said gate oxide layer simultaneously with the removal of said gate oxide layer at said predetermined site.

* * * * *